(12) United States Patent
Wang (10) Patent No.: US 7,705,461 B2
(45) Date of Patent: Apr. 27, 2010

(54) STRUCTURE OF TAG INTEGRATED CIRCUIT FLEXIBLE BOARD

(75) Inventor: Pei-Choa Wang, Gueishan Township, Taoyuan County (TW)

(73) Assignee: Pyroswift Holding Co., Limited, Wanchai (HK)

( * ) Notice: Subject to any disclaimer, the term of this patent is extended or adjusted under 35 U.S.C. 154(b) by 22 days.

(21) Appl. No.: 12/197,415

(22) Filed: Aug. 25, 2008

(65) Prior Publication Data

US 2008/0310129 A1    Dec. 18, 2008

Related U.S. Application Data

(62) Division of application No. 11/757,360, filed on Jun. 2, 2007, now Pat. No. 7,504,320.

(51) Int. Cl.
*H01L 23/48* (2006.01)
(52) U.S. Cl. ..................... 257/758; 257/760; 257/753; 257/E33.055

(58) Field of Classification Search ......... 257/679–686, 257/758–760, E33.055; 438/612–624
See application file for complete search history.

(56) References Cited

U.S. PATENT DOCUMENTS

| 2008/0289860 A1* | 11/2008 | Kita et al. .................. 174/254 |
| 2009/0056995 A1* | 3/2009 | Maeda et al. ............... 174/259 |
| 2009/0191387 A1* | 7/2009 | Paul et al. ................. 428/195.1 |

* cited by examiner

*Primary Examiner*—Dung A Le
(74) *Attorney, Agent, or Firm*—Chun-Ming Shih (57) ABSTRACT

A structure of a tag integrated circuit flexible board includes a base material, one surface thereof having an adhesive layer; and a plurality of integrated circuit flexible boards that are arranged adjacent to one another and adhered on the adhesive layer of the base material. The integrated circuit flexible board includes an insulating heat-conductive material, and a conductive circuit layer provided on a surface of the insulating heat-conductive material and formed of a plurality of sections of circuits.

14 Claims, 10 Drawing Sheets

FIG.8

# STRUCTURE OF TAG INTEGRATED CIRCUIT FLEXIBLE BOARD

This application is a divisional application of U.S. patent application Ser. No. 11/757,360, filed on Jun. 2, 2007 now U.S. Pat. No. 7,504,320.

BACKGROUND OF THE INVENTION

1. Field of the Invention

The present invention relates to a flexible circuit board, and in particular to a structure of a tag flexible circuit board.

2. Description of Prior Art

When traditional light-emitting diodes are manufactured, a band-like or piece-like copper metallic plate is first pressed to form a plurality of lead frames that are connected with one another. A base is formed on each lead frame by means of a resin injection molding or hot press-forming process. The base has a cavity for allowing the lead frame to be exposed. Then, the lead frame in the cavity is subjected to a chip-fixing step and a wiring step. After finishing the chip-fixing and wiring steps, fluorescent glue and epoxy resin are dotted in the cavity to form a light-emitting diode.

After the light-emitting diode is manufactured completely, the lead frame is cut to separate the light-emitting diode from the boundary of the lead frame, thereby forming a single light-emitting diode. When the light-emitting diodes are packed, a plurality of light-emitting diodes is packed into a common bag simultaneously, so that it is convenient to carry or transport them. However, such way of packing may cause the light-emitting diodes to be pressed by each other, causing the damage of the base, pins and lens of the light-emitting diodes. Further, if the bag is broken, the plurality of light-emitting diodes may fall into the ground immediately, so that the light-emitting diodes may get damaged or contaminated by the dirt on the ground.

Recently, many electronic products are gradually made to be more and more compact. Therefore, the interior of the electronic product has to be provided with a SMD small-sized circuit board. In manufacturing the SMD small-sized circuit board, a circuit substrate made of a hard material and having a larger area is printed with a plurality of identical circuits first. After performing a developing or etching technique, the surface of the circuit substrate is formed with a plurality of circuit layers. Then, SMD electronic components (such as chip, resistor, capacitor, diode or transistor) are soldered on the circuit layers of the circuit substrate. After soldering the electronic components, the circuit substrate is cut to form a plurality of small-sized circuit boards. Before these small-sized circuit boards are subjected to the subsequent processing and assembling step, they are laminated in a collecting box or pressed in a package bag randomly, so that these circuit boards may be pressed by each other. As a result, the SMD electronic components and the circuits on the circuit board may fall off or the electrical connection is deteriorated. Therefore, many bad products may be generated in the subsequent process.

SUMMARY OF THE INVENTION

The present invention is to provide a structure of a tag integrated circuit flexible board, whereby electronic components can be soldered on the integrated circuit flexible board to form tag electronic elements. After manufacturing the elements, they can be rolled up or folded to avoid the possible damage of the electronic elements. In this way, it is also convenient to carry or transport them.

In order to achieve the above objects, the present invention provides a structure of a tag integrated circuit flexible board. First, copper foil, an insulating heat-conductive material and a base material coated with an adhesive layer are prepared. After being treated by a hot-pressing process, the copper foil, the insulating heat-conductive material and the base material are combined together to form a continuous band-like or sheet-like copper foil flexible board. The surface of the copper foil is formed with a photoresist layer for forming circuits. After performing a developing or etching process, the portion of copper foil that is not covered with the photoresist layer is removed. Only the portion of copper foil that is covered with the photoresist layer is left. Then, the photoresist layer is removed, so that a plurality of sections of circuits (scribed by a laser process) is formed on the insulating heat-conductive material. The surface of the plurality of sections of circuits is plated with a silver metallic layer. The surface of the silver metallic layer is soldered with electronic components and an outer covering body is packaged thereon. Finally, the copper foil flexible board is cut to an extent that the insulating heat-conductive material is cut while leaving the base material uncut. As a result, the base material has a plurality of integrated circuit flexible boards.

DETAILED DESCRIPTION OF THE INVENTION

The technical contents and the detailed description of the present invention will be explained with reference to the accompanying drawings.

Figure 1:
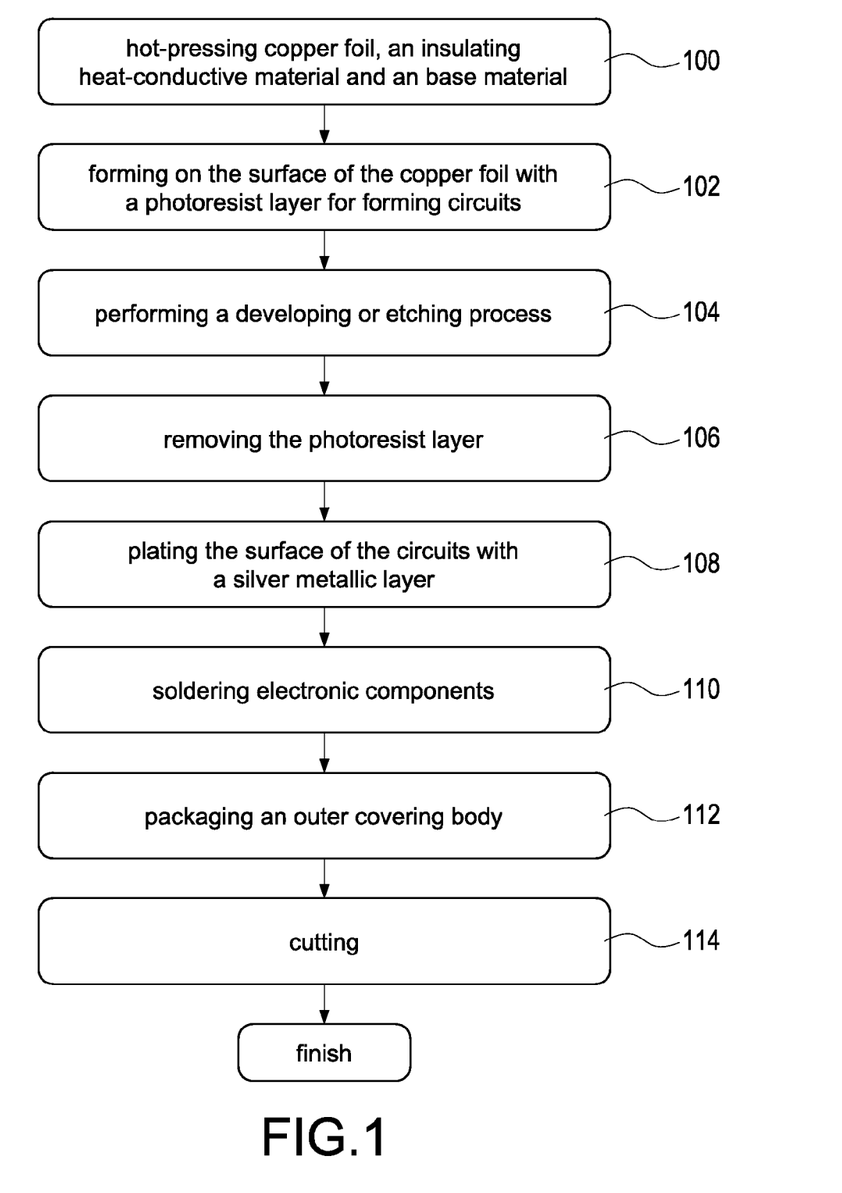
FIG. 1 is a flow chart of the method for manufacturing a light-emitting diode with the tag integrated circuit flexible board of the present invention and the associated electronic elements.
Figure 2A:
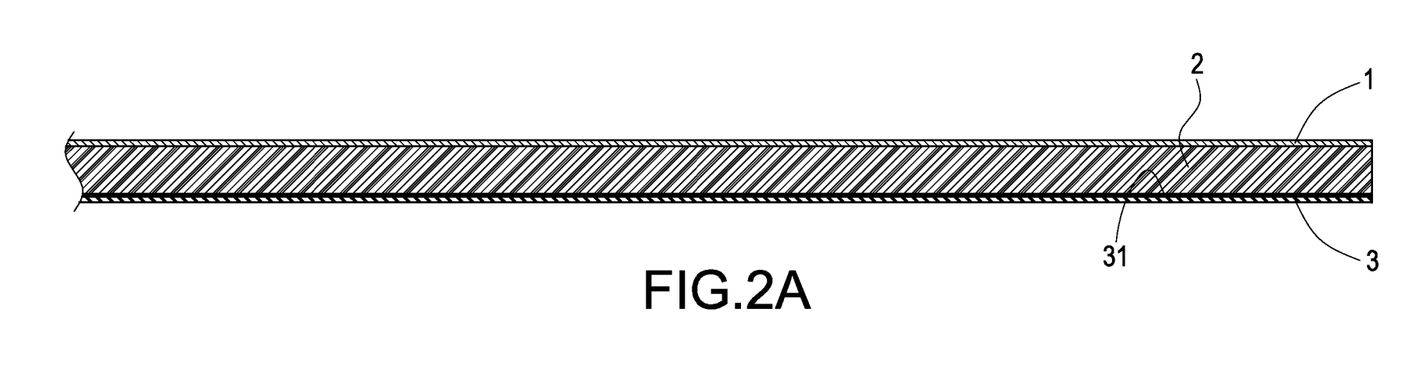
FIG. 2A is a side view showing the copper foil flexible board of the present invention.

With reference to FIG. 1, it is a flow chart of the method for manufacturing the tag integrated circuit flexible board of the present invention and the associated electronic elements. As shown in this figure, the method for manufacturing a tag integrated circuit flexible board of the present invention comprises the steps as follows. Please also refer to FIG. 2A, first, in step 100, copper foil 1, an insulating heat-conductive material 2 and a base material 3 coated with an adhesive layer 31 are prepared. After being treated by a hot-pressing process, the copper foil 1, the insulating heat-conductive material 2 and the base material 3 are combined together to form a continuous band-like or sheet-like copper foil flexible board. In the drawings, the base material 3 is any one of a glue sheet or a thin metallic sheet. The thin metallic sheet can be any one of copper foil or aluminum foil.

Figure 2B:
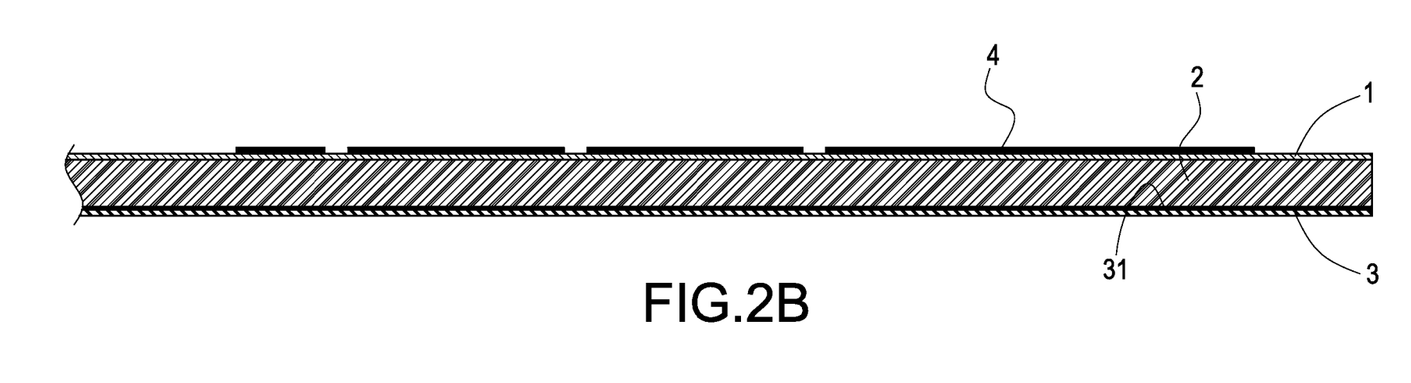
FIG. 2B is a side view showing that the copper foil flexible board of the present invention is coated with a photoresist layer.
Figure 2C:
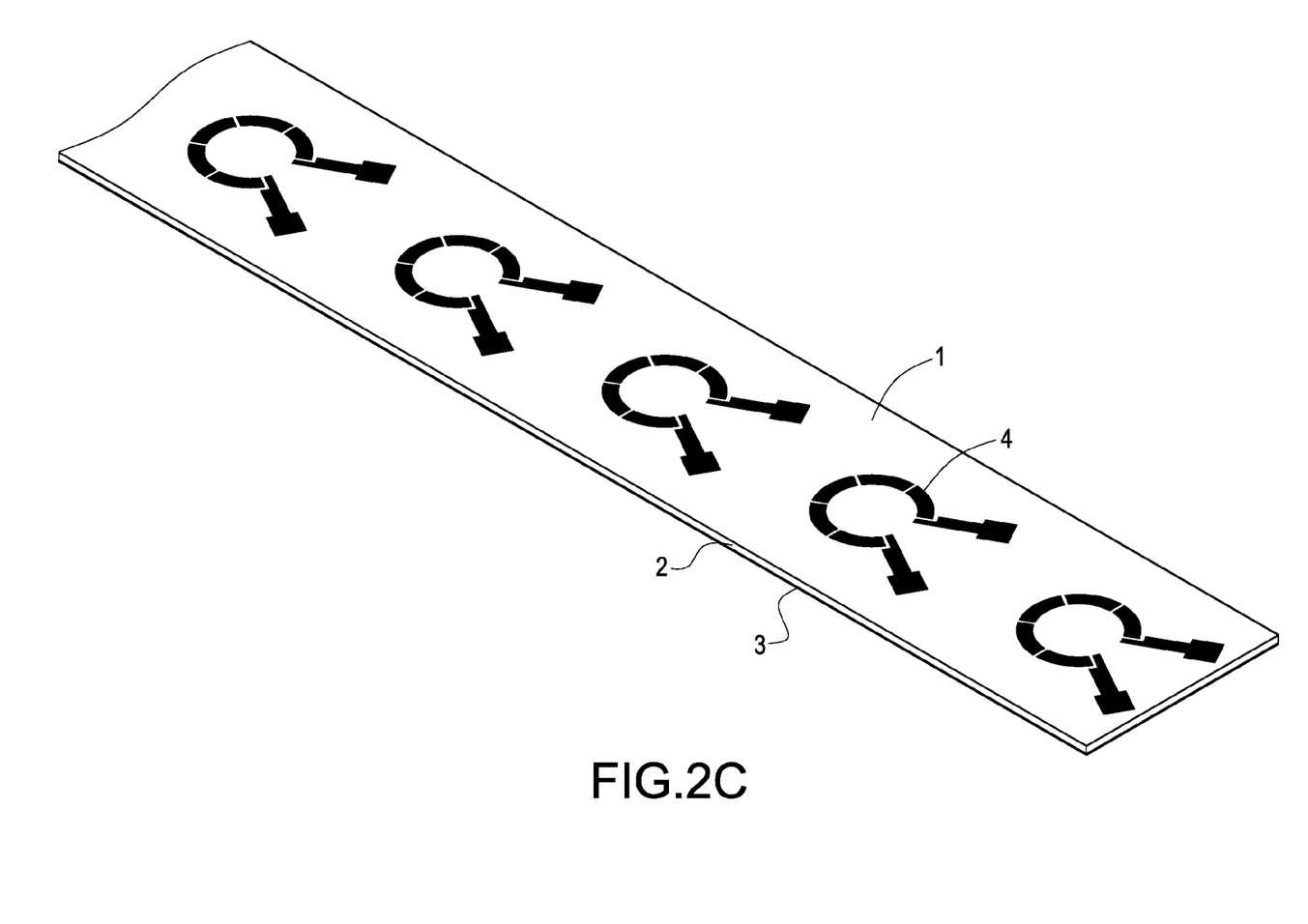
FIG. 2C is a perspective view showing that the copper foil flexible board of the present invention is coated with a photoresist layer.

In step 102, with reference to FIG. 2B and FIG. 2C, the surface of the copper foil 1 is formed with a photoresist layer 4 for forming circuits thereon.

Figure 2D:
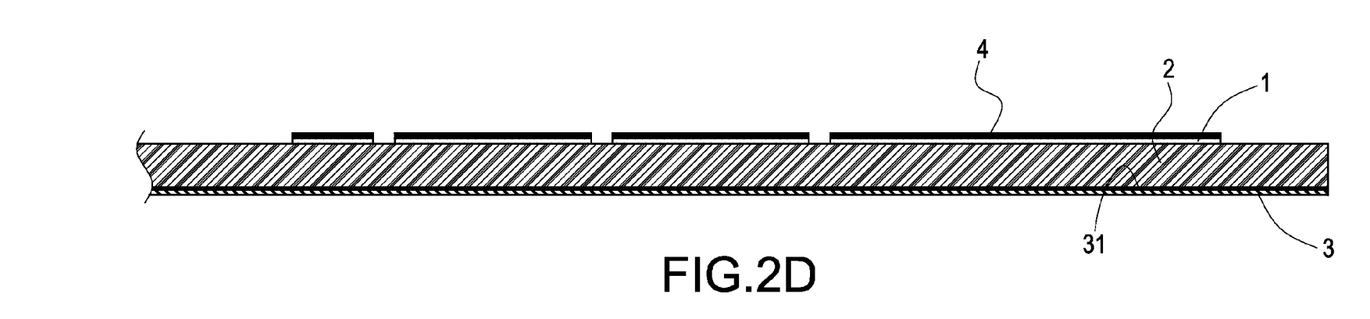
FIG. 2D is a side view showing the copper foil flexible board of the present invention after being subjected to a developing, etching or a laser process.

In step 104, with reference to FIG. 2D, after being treated by a developing or etching process, the portion of the copper foil 1 that is not covered with the photoresist layer 1 is etched off, while leaving the portion of the copper foil 1 that is covered with the photoresist layer 4.

Figure 2E:
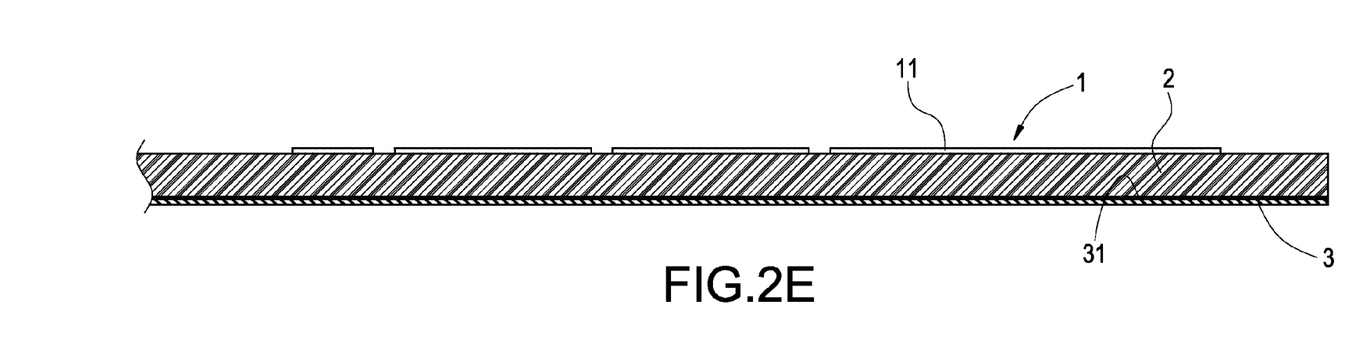
FIG. 2E is a side view showing that the photoresist layer is removed from the copper foil flexible board of the present invention.
Figure 2F:
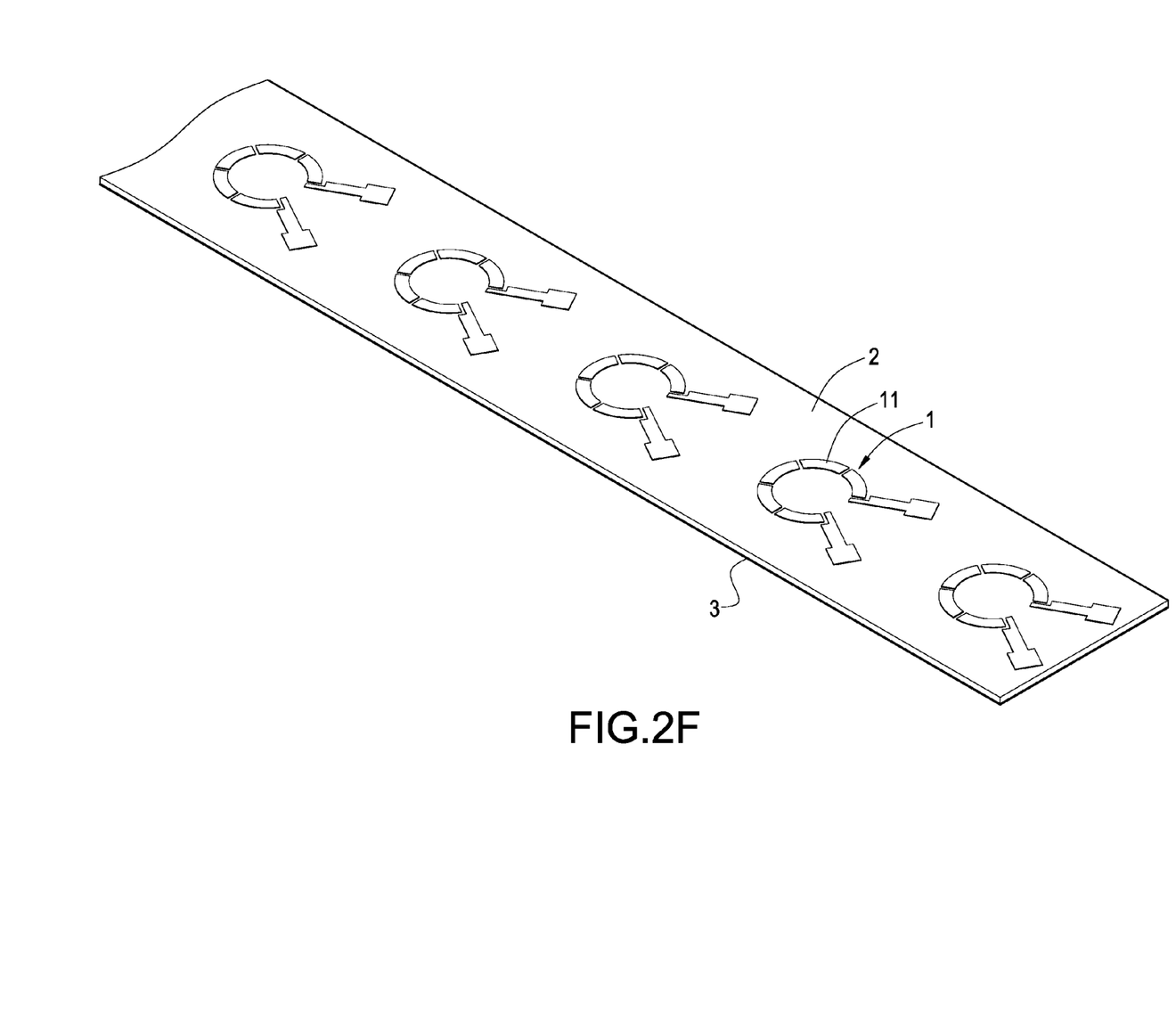
FIG. 2F is a perspective view showing that the photoresist layer is removed from the copper foil flexible board of the present invention.

In step 106, with reference to FIG. 2E and FIG. 2F, after removing the photoresist layer 4, on the copper foil 1, the plurality of sections of circuits 11 that are made by the developing or etching process are exposed to the surface of the insulating heat-conductive material 2 so as to form a conductive circuit layer. The plurality of sections of circuits can be also scribed by means of a laser process.

Figure 3:
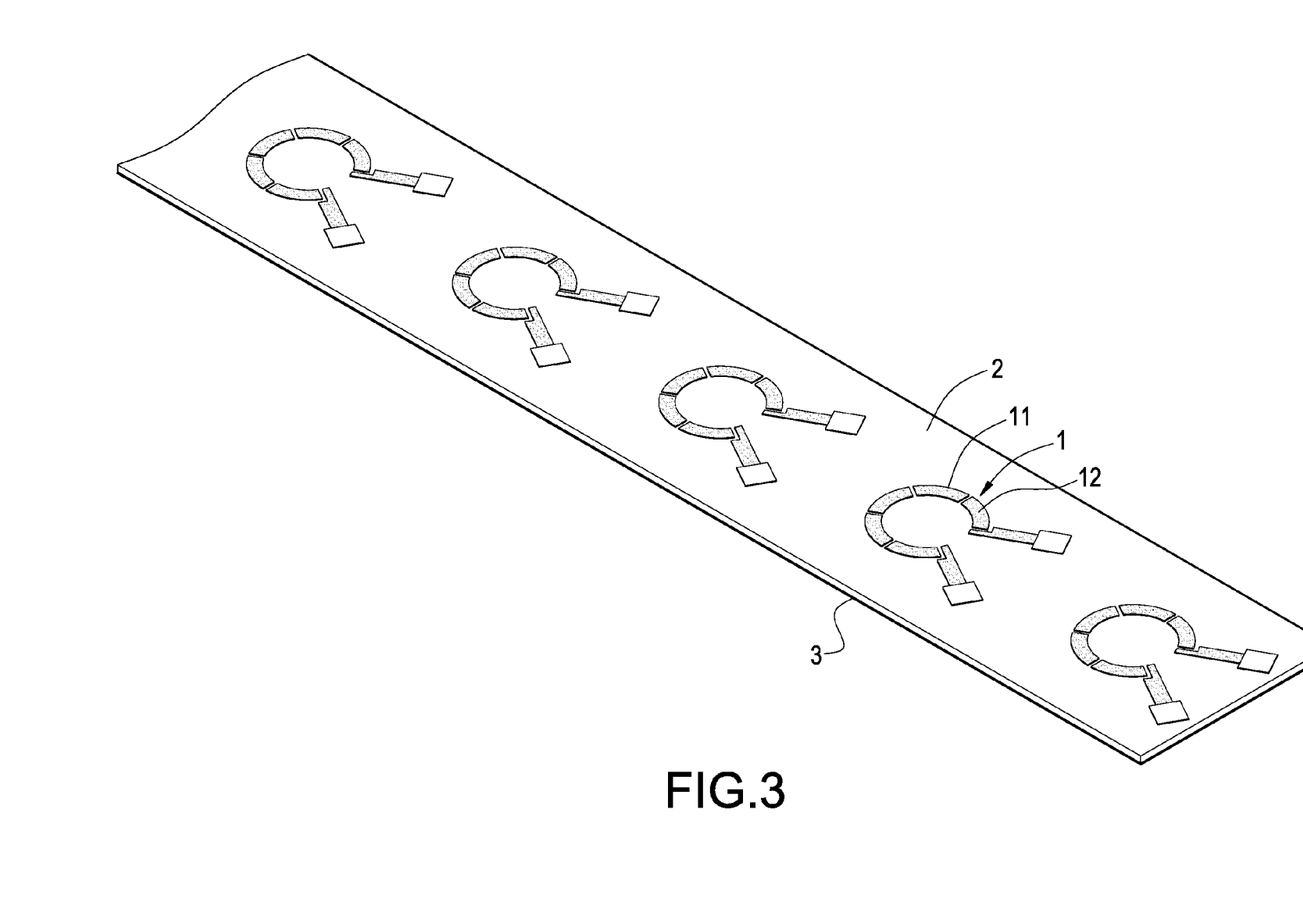
FIG. 3 is a perspective view showing that the circuit surface of the copper foil flexible board of the present invention is plated with silver.

In step 108, with reference to FIG. 3, the surface of the plurality of sections of circuits 11 are plated with a silver metallic layer 12.

Figure 4:
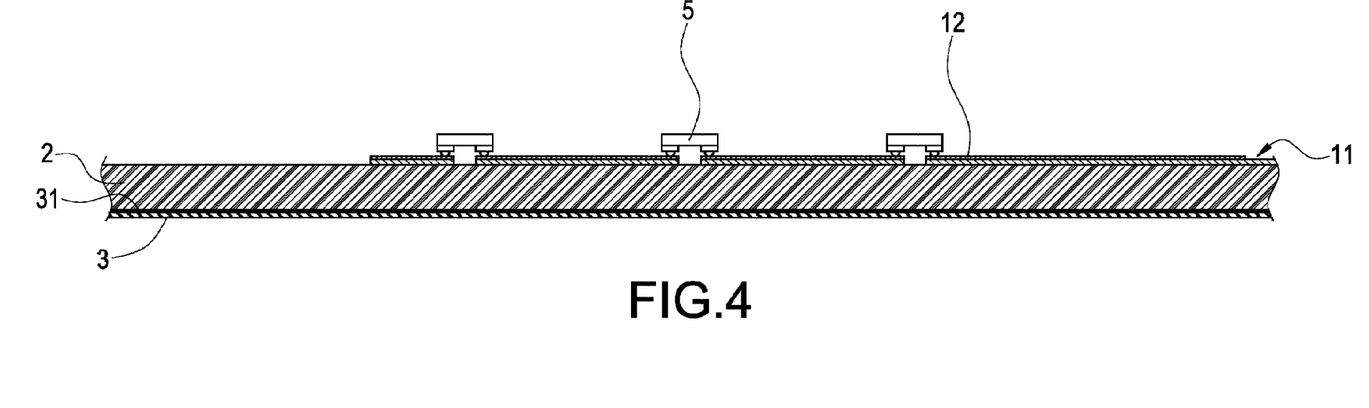
FIG. 4 is a schematic view showing that the circuit surface of the copper foil flexible board of the present invention is soldered with electronic components.

In step 110, with reference to FIG. 4, the surface of the silver metallic layer 12 is soldered with SMD electronic components 5. When the electronic components 5 are brought into contact with the silver metallic layer 12, after being heated, the electronic components 5 can be soldered with the silver metallic layer 12. In the drawing, the SMD electronic component 5 is any one of a semiconductor IC chip or a light-emitting chip of a light-emitting diode. Further, the silver metallic layer 12 can reflect the light generated by the light-emitting chip.

Figure 5:
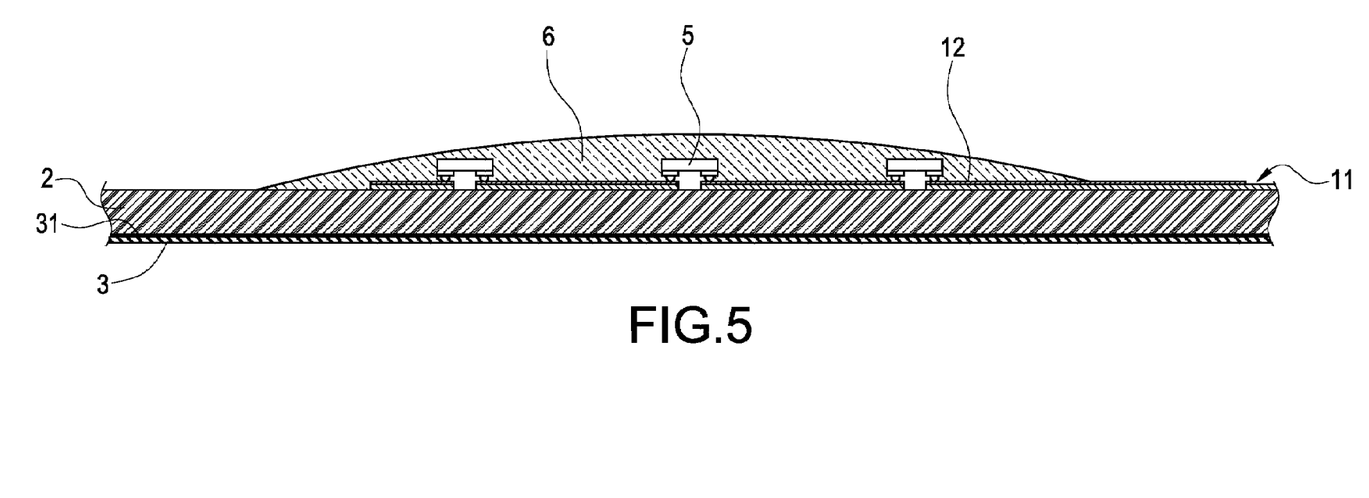
FIG. 5 is a schematic view showing that an outer covering body is packaged, also shown in FIG. 7.

In step 112, with reference to FIG. 5, the surface of the insulating heat-conductive material 2 is packaged with an outer covering body 6 to cover the SMD electronic components 5.

Figure 6:
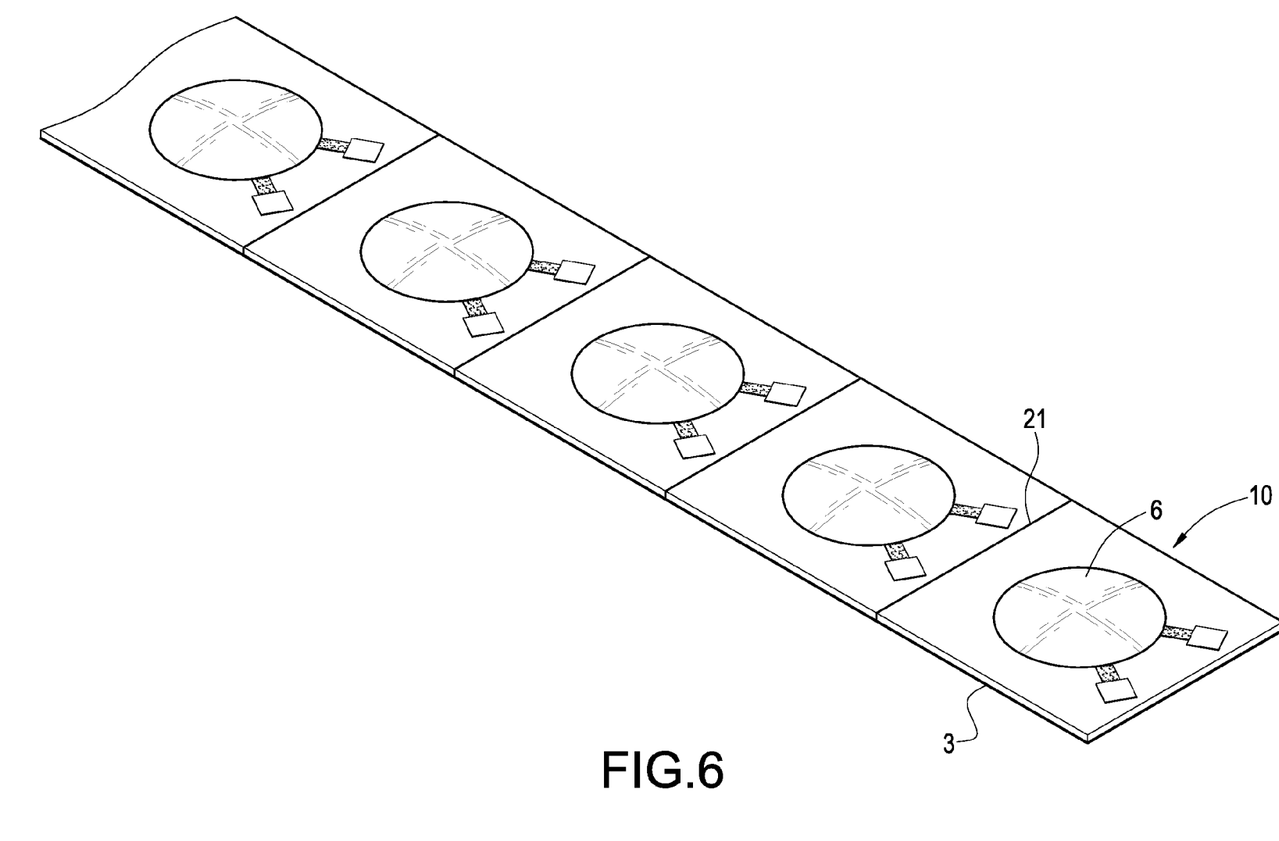
FIG. 6 is a schematic view showing the copper foil flexible board of the present invention after cutting.

In step 120, with reference to FIG. 6, the band-like or sheet-like copper foil flexible board is cut. In cutting, the insulating heat-conductive material 2 is cut to form cutting seams 21 thereon while the base material 3 is not cut. In this way, the electronic elements 10 on the band-like or sheet-like base material 3 form a plurality of adjacent elements that are adhered on the base material 3. Thus, the packaging of the tag electronic elements is completed.

Figure 7:
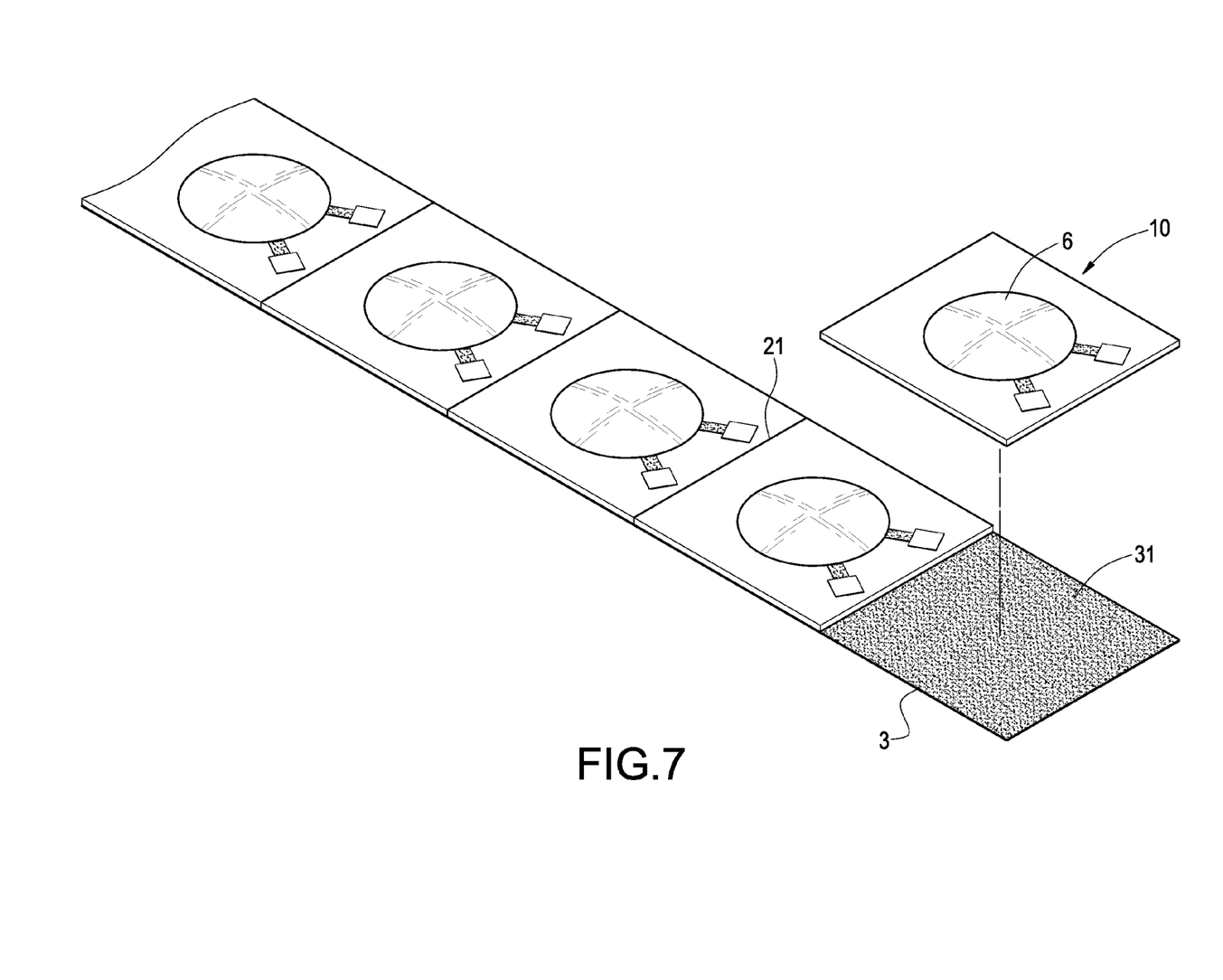
FIG. 7 is a schematic view showing an operating state in which the packaging of electronic elements is finished on the tag integrated circuit flexible board of the present invention.

With reference to FIG. 7, it is a schematic view showing an operating state in which the packaging of electronic elements is finished on the tag integrated circuit flexible board of the present invention. As shown in this figure, after the packaging of the electronic elements (such as light-emitting diodes) is finished on the tag integrated circuit flexible board of the present invention, the insulating heat-conductive material 2 is peeled off, so that the insulating heat-conductive material 2 can be peeled from the adhesive of the base material 3. In this way, the back of the insulating heat-conductive material 2 is adhesive slightly, so that the insulating heat-conductive material 2 can be adhered on the associated carriers.

Figure 8:
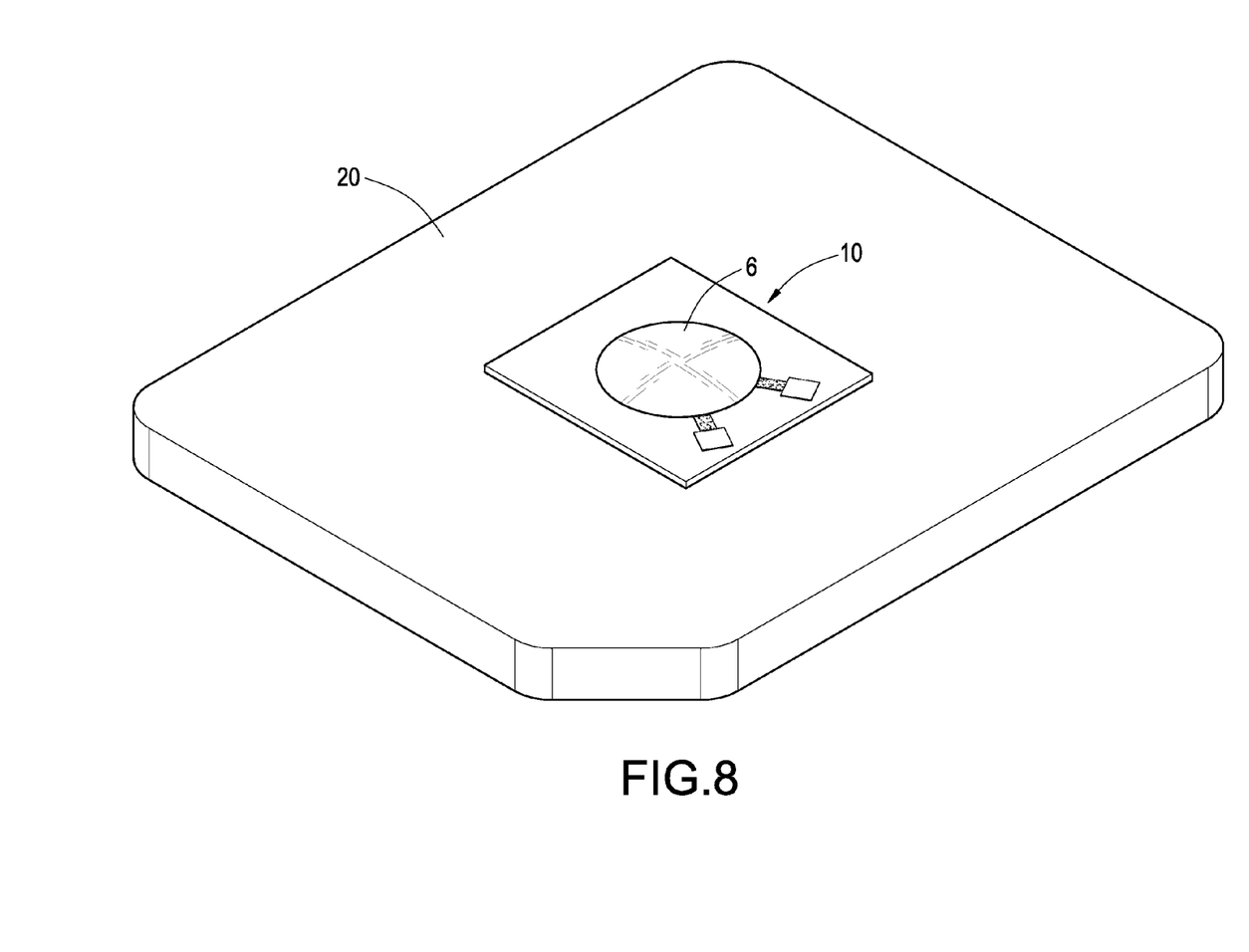
FIG. 8 is a schematic view showing another operating state in which the packaging of electronic elements is finished on the tag integrated circuit flexible board of the present invention.

With reference to FIG. 8, it is a schematic view showing another operating state in which the packaging of electronic elements is finished on the tag integrated circuit flexible board of the present invention. As shown in this figure, after the packaging of the electronic elements is finished on the tag integrated circuit flexible board of the present invention, the insulating heat-conductive material 2 is peeled from the base material, so that the insulating heat-conductive material 2 can be adhered on an isothermal plate 20. After being heated, the insulating heat-conductive material 2 of the integrated circuit flexible board can be combined with the isothermal plate 20.

After the packaging of the electronic elements is finished on the tag integrated circuit flexible board of the present invention, the user can peel off the electronic elements from the base material when he intends to use the electronic elements. Also, after the manufacturing of the tag electronic elements is finished, the thus-manufactured electronic elements are easy to fold and carry. Furthermore, the plurality of electronic elements can be avoided from being pressed or damaged when carried. Also, the package volume can be made smaller to facilitate the carry.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A structure of a tag integrated circuit flexible board, comprising:
   a base material, one surface thereof having an adhesive layer; and
   a plurality of integrated circuit flexible boards that are arranged adjacent to one another and adhered on the adhesive layer of the base material, wherein each of the integrated circuit flexible boards has an insulating heat-conductive material, and a surface of the insulating heat-conductive material is provided with a conductive circuit layer formed of a plurality of sections of circuits, cutting seams being formed between insulating heat-conductive material of adjacent integrated circuit flexible boards.

2. The structure of a tag integrated circuit flexible board according to claim 1, wherein the base material is formed into a band-like shape or a sheet-like shape.

3. The structure of a tag integrated circuit flexible board according to claim 1, wherein the base material is a glue sheet or a thin metallic sheet.

4. The structure of a tag integrated circuit flexible board according to claim 3, wherein the thin metallic sheet is a copper foil or an aluminum foil.

5. The structure of a tag integrated circuit flexible board according to claim 1, wherein the surface of the conductive circuit layer is provided with a silver metallic layer.

6. The structure of a tag integrated circuit flexible board according to claim 5, further comprising one electronic component electrically connecting to the silver metallic layer.

7. The structure of a tag integrated circuit flexible board according to claim 6, wherein the electronic component is a semiconductor IC chip or light-emitting chip of a light-emitting diode.

8. A structure of a tag integrated circuit flexible board, comprising:
- a base material, one surface thereof having an adhesive layer;
- a plurality of integrated circuit flexible boards that are arranged adjacent to one another and adhered on the adhesive layer of the base material, the integrated circuit flexible board including:
  - an insulating heat-conductive material; and
  - a conductive circuit layer provided on a surface of the insulating heat-conductive material and formed of a plurality of sections of circuits, wherein cutting seams being formed between insulating heat-conductive material of adjacent integrated circuit flexible boards.

9. The structure of a tag integrated circuit flexible board according to claim 8, wherein the base material is formed into a band-like shape or a sheet-like shape.

10. The structure of a tag integrated circuit flexible board according to claim 8, wherein the base material is a glue sheet or a thin metallic sheet.

11. The structure of a tag integrated circuit flexible board according to claim 10, wherein the thin metallic sheet is a copper foil or an aluminum foil.

12. The structure of a tag integrated circuit flexible board according to claim 10, wherein the surface of the conductive circuit layer is provided with a silver metallic layer.

13. The structure of a tag integrated circuit flexible board according to claim 12, further comprising one electronic component electrically connecting to the silver metallic layer.

14. The structure of a tag integrated circuit flexible board according to claim 13, wherein the electronic component is a semiconductor IC chip or a light-emitting chip of a light-emitting diode.

* * * * *